US008810305B2

(12) United States Patent
Takahashi

(10) Patent No.: US 8,810,305 B2
(45) Date of Patent: Aug. 19, 2014

(54) SEMICONDUCTOR DEVICE

(75) Inventor: Hiroyuki Takahashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 1617 days.

(21) Appl. No.: 11/717,160

(22) Filed: Mar. 13, 2007

(65) Prior Publication Data

US 2007/0216465 A1    Sep. 20, 2007

(30) Foreign Application Priority Data

Mar. 20, 2006  (JP) ................... 2006-076567

(51) Int. Cl.
 *G05F 1/10* (2006.01)
 *G05F 3/02* (2006.01)
 *H03K 3/01* (2006.01)
 *H03L 5/00* (2006.01)

(52) U.S. Cl.
 USPC ............................ 327/535; 327/333; 327/534

(58) Field of Classification Search
 USPC .............. 327/200, 333, 534, 535; 365/185.22
 See application file for complete search history.

(56) References Cited

U.S. PATENT DOCUMENTS

| | | | | |
|---|---|---|---|---|
| 5,488,327 A | * | 1/1996 | Okada | 327/536 |
| 5,574,634 A | * | 11/1996 | Parlour et al. | 363/59 |
| 6,009,015 A | * | 12/1999 | Sugiyama | 365/185.22 |
| 7,397,298 B2 | * | 7/2008 | Tsukude | 327/535 |

FOREIGN PATENT DOCUMENTS

JP    2000-261310    9/2000

\* cited by examiner

*Primary Examiner* — Lincoln Donovan
*Assistant Examiner* — Colleen O Toole
(74) *Attorney, Agent, or Firm* — Young & Thompson

(57) ABSTRACT

There is provided a semiconductor device including a first logic circuit to operate based on a first power supply and a second power supply, and a second logic circuit to operate based on the first power supply and a third power supply boosted from the second power supply. The second logic circuit includes a holding section to hold a value generated according to a first signal and a second signal operating asynchronously with respect to each other.

15 Claims, 5 Drawing Sheets

RELATED ART

SEMICONDUCTOR DEVICE

BACKGROUND OF THE INVENTION

1. Field of the Invention

The present invention relates to semiconductor devices and particularly to a semiconductor device including a holding circuit which operates according to signals asynchronous with respect to each other.

2. Description of Related Art

A logic circuit which operates according to a plurality of signals that are asynchronous with respect to each other cannot ensure meeting the specification of a setup time or a hold time of the logic circuit in relation to the signals relative to each other. Thus, the logic circuit which operates according to asynchronous signals inevitably enters a metastable state where an output value is indeterminate.

The metastable state is described hereinafter with reference to a latch circuit as an example. FIG. 3 is a circuit diagram of a latch circuit 11. The latch circuit 11 may be a circuit to store the operational state of a memory cell in a DRAM, for example. Specifically, the latch circuit 11 stores either the refresh state or the read/write state according to an input signal. A processor 12 controls the operational state of a memory cell according to the output of the latch circuit 11.

The latch circuit 11 includes a set terminal S, a reset terminal R, and an output terminal Q. FIG. 4 is a timing chart of the operation of the latch circuit 11. As shown in FIG. 4, after a High-level Refresh signal is input to the reset terminal R, the latch circuit 11 holds the refresh state until a Low-level R/W signal is input to the set terminal R. On the other hand, after a Low-level R/W signal is input to the set terminal R, the latch circuit 11 holds the read/write state until a High-level Refresh signal is input to the reset terminal R.

If the changing R/W and Refresh signals relative to each other cannot meet the specification of a setup time or a hold time, the values held in the holding section 13 may not be fixed to either High level or Low level. This occurs, for example, when the signals are input at the same time to the set terminal S and the reset terminal R and as a result the value held by the holding section 13 is stabilized at an intermediate voltage (i.e. the timings t3 to t5 in FIG. 4).

The state where the latch circuit 11 holds an intermediate voltage such that an indeterminate state is transferred to a circuit in the subsequent stage is called a metastable state (i.e. the timings t5 to t6 in FIG. 4). Although the metastable state shifts to a High-level or Low-level state after a certain time period, the length of the period is unpredictable. Metastable states occur inevitably in a circuit to determine a value to hold according to signals that are asynchronous with respect to each other.

Various methods have been proposed to prevent metastable states. One exemplary method predicts the time when an output becomes unstable and adds a delay to the clock input to a processor connected with a circuit where a metastable state can occur. This method uses the fact that a period when a circuit output is unstable due to metastable is only temporary. Another exemplary method prevents metastable based on the majority decision of a plurality of latch circuits as disclosed in Japanese Unexamined Patent Publication No. 2000-261310 (referred to hereinafter as the related art 1).

FIG. 5 shows a logic LSI 100 according to the related art 1. The logic LSI 100 is a semiconductor device that operates in synchronization with a system clock SCK and receives an input signal AsyncIn that changes asynchronous with respect to the system clock SCK. Metastable states can thereby occur in the logic LSI 100.

As a measure to metastable states, the logic LSI 100 includes delay circuits 101a to 101n respectively having different delay times and flip-flops 102a to 102n to store asynchronous signals AsyncIn in synchronization with system clocks SCK. The flip-flops 102a to 102n are respectively connected with the corresponding delay circuits 101a to 101n. Asynchronous signals AsyncIn are input to the flip-flops 102a to 102n through the corresponding delay circuits 101a to 101n. Therefore, the asynchronous signals AsyncIn which are input to the flip-flops 102a to 102n delay by the connected delay circuits, so that the asynchronous signal AsyncIn and the system clock SCK which are input to each flip-flop have different timings from each other.

The outputs of the flip-flops 102a to 102n are input to a comparator 103. The comparator 103 selects a majority logic value among the outputs of the flip-flops 102a to 102n based on majority rule and outputs the majority logic value. A processor 104 operates according to the output of the comparator 103.

In the logic LSI 100 of the related art 1, input signals with different delay times are latched by a plurality of flip-flips, and a logic value is determined by majority rule. Thus, even when a metastable state occurs in some flip-flop, an error associated with the metastable state is not transmitted to the processor 104 because a majority logic value is determined by majority rule using the output values of the other flip-flops.

However, the logic LSI 100 of the related art 1 needs to include a plurality of delay circuits, a plurality of flip-flops, and a comparator, which causes an increase in circuit size. Further, a delay time until a signal is transmitted to a processor increases due to the delay circuits. A longer delay time until a signal is transmitted to a processor causes a longer time required to start executing the operation in response to an input signal. Accordingly, if a time period from the input of a signal to the end of the operation corresponding to the input signal is specified, it is sometimes unable to meet the specification. For example, a time period from the input of a read command to the output of data is specified for memories, and a too long internal signal delay time causes a failure to meet the specification on the time period from the command input to the data output.

SUMMARY OF THE INVENTION

According to one aspect of the present invention, there is provided a semiconductor device including a first logic circuit to operate based on a first power supply and a second power supply, and a second logic circuit to operate based on the first power supply and a third power supply boosted from the second power supply, wherein the second logic circuit includes a holding section to hold a value generated according to a first signal and a second signal operating asynchronously with respect to each other.

According to another aspect of the present invention, there is provided a semiconductor device including a state holding circuit to operate according to a first signal and a second signal operating asynchronously with respect to the first signal, and a processor to operate according to the first signal and an output of the state holding circuit, wherein the state holding circuit includes a holding section to hold a value generated according to the first signal and the second signal, and the holding section is composed of a transistor having smaller resistance in conducting state than a transistor of the processor to receive an output of the state holding circuit.

According to yet another aspect of the present invention, there is provided a semiconductor device including a booster to operate based on a first power supply and a second power supply and generate a third power supply boosted from the second power supply, and a second logic circuit to operate based on the first power supply and the third power supply, wherein the second logic circuit includes a first circuit to operate according to a first signal and a second signal input asynchronously with respect to each other, and a holding section to hold an output of the first circuit.

The semiconductor device of the present invention supplies a higher power supply voltage than a voltage supplied to another circuit to or uses a transistor having low resistance (high current capability) in conducting state in a holding section to hold a value generated by a first signal and a second signal operating asynchronously with respect to each other. This reduces a time needed to stabilize a held value to High or Low level when the holding section holds a value to cause a metastable state. Specifically, the device allows a large current to flow when a metastable state shifts to High or Low level only slightly, thereby stabilizing the value held in the holding section at High or Low level in a short time. Further, the semiconductor device of the present invention eliminates the need to add a delay circuit or the like, thus not increasing a circuit size.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
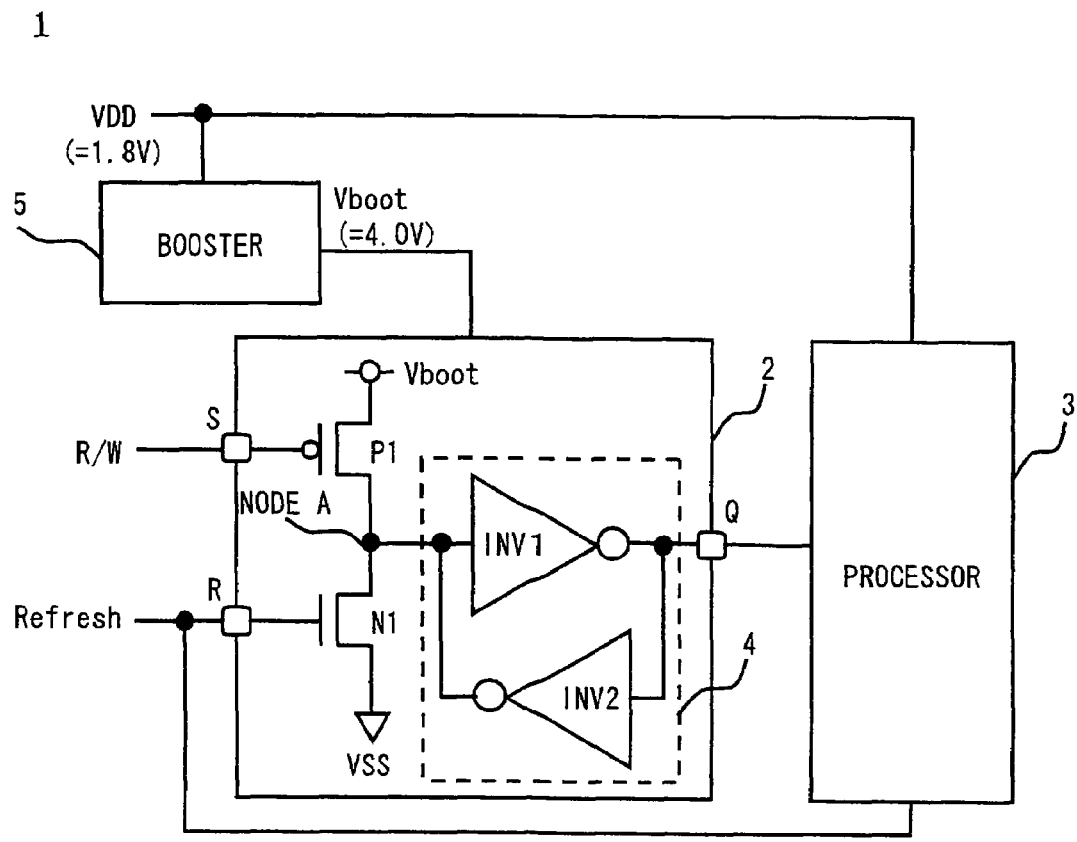
FIG. 1 is a circuit diagram of a semiconductor device according to a first embodiment of the present invention.

An exemplary embodiment of the present invention is described hereinafter with reference to the drawings. FIG. 1 is a block diagram of a semiconductor device 1 according to a first embodiment of the present invention. The semiconductor device 1 of this embodiment may be a memory such as a DRAM (Dynamic Random Access Memory), which determines an operational state based on two signals operating asynchronously with respect to each other. In a DRAM, a Refresh signal generated inside and a R/W (Read/Write) signal transmitted from outside operate asynchronously with respect to each other, and the state of a memory cell is set to a read/write state or a refresh state according to those two signals. A DRAM uses a latch circuit to set the state to either one of the two states. A Refresh signal and a R/W signal are respectively supplied to different inputs of the latch circuit, and either one of the read/write and refresh states is determined according to the output of the latch circuit.

As shown in FIG. 1, the semiconductor device 1 includes a state holding circuit (e.g. a second logic circuit or a latch circuit) 2, a processor (e.g. a first logic circuit) 3, and a booster 5. The latch circuit 2 is a non-processing circuit which holds a prescribed state according to a first signal (e.g. a R/W signal) and a second signal (e.g. a Refresh signal) that operates asynchronously with respect to each other. The latch circuit 2 operates according to a first power supply (e.g. a ground voltage VSS) and a third power supply (e.g. a boosted voltage Vboot) which is generated by boosting a second power supply that is supplied to the semiconductor device 1 (e.g. a power supply voltage VDD) inside the semiconductor device 1. The booster 5 operates according to the power supply voltage VDD and the ground voltage VSS to generate the boosted voltage Vboot that is stepped up from the power supply voltage VDD. A charge pump or the like may be used as the booster 5.

The processor 3 operates by receiving the output of the latch circuit 2 in synchronization with the Refresh signal and it controls a memory cell according to the output of the latch circuit 2. The processor 3 operates based on the ground voltage VSS and the power supply voltage VDD. The power supply voltage VDD may be about 1.8 V, and the boosted voltage Vboot may be about 4.0 V. The processor 3 includes a peripheral circuit and a receiver circuit and so on.

The latch circuit 2 is described hereinafter in detail. The latch circuit 2 includes a first circuit including a PMOS transistor P1 and an NMOS transistor N1, and a holding section 4. The PMOS transistor P1 receives a R/W signal through its gate. The NMOS transistor N1 receives a Refresh signal through its gate. The PMOS transistor P1 and the NMOS transistor N1 are connected in series between the ground voltage VSS and the boosted voltage Vboot. The drains of the PMOS transistor P1 and the NMOS transistor N1 are connected with each other at a node A, to which the holding section 4 is connected. The holding section 4 thus holds a voltage at the node A.

The holding section 4 includes inverters INV1 and INV2. The input of the inverter INV1 is connected with the node A, and the output of the inverter INV1 serves as an output Q of the latch circuit 2. Further, the output of the inverter INV1 is connected with the input of the inverter INV2. The output of the inverter INV2 is connected with the input of the inverter INV1. The inverters INV1 and INV2 operate with the ground voltage VSS and the boosted voltage Vboot as power supply.

The transistors constituting the latch circuit 2 preferably have a withstand voltage which prevents breakdown even when the ground voltage VSS and the boosted voltage Vboot are applied to power supply, for example. Further, the transistors constituting the latch circuit 2 have lower resistance (higher current capability) in the conducting state than a transistor used in the processor 3. For example, even if each transistor of the latch circuit 2 is the same element as the transistor of the processor 3 which receives the output of the holding section 4, the voltage applied to the gate of each transistor increases when the ground voltage VSS and the boosted voltage Vboot are applied as power supply and consequently the resistance of each transistor in the conducting state decreases. Further, when the ground voltage VSS and the boosted voltage Vboot are applied as power supply, the voltage between the source and drain of each transistor increases and thereby the amount of current flowing between the source and drain increases accordingly. Furthermore, the resistance of each transistor in the conduction state can be low even when the ground voltage VSS and the boosted voltage Vboot are applied as power supply by using a MTMOS (Multi Threshold MOS) that has a plurality of threshold voltages and features low resistance in the conducting state and low leakage current in the non-conducting state, a VTMOS (Variable Threshold MOS) that enables a change in thresholds, or the like. In addition, with a use of a MOS transistor, the resistance in the conduction state can be normally reduced by increasing the gate width W of the transistor.

Figure 2:
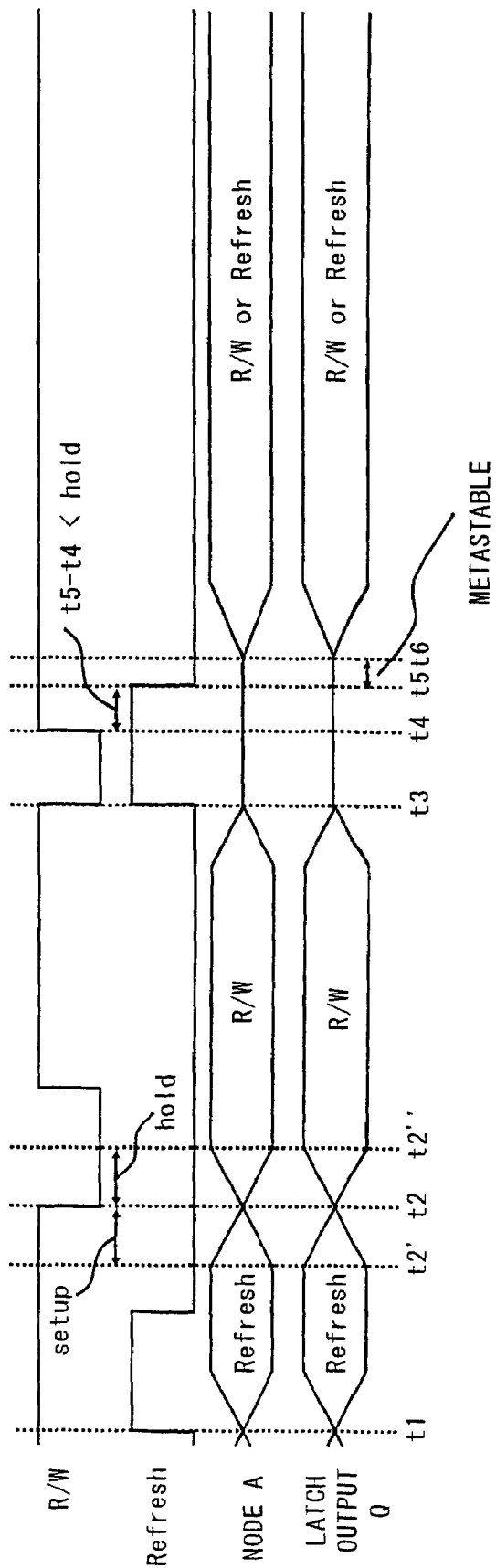
FIG. 2 is a view showing a timing chart of a latch circuit according to the first embodiment of the present invention.
Figure 3:
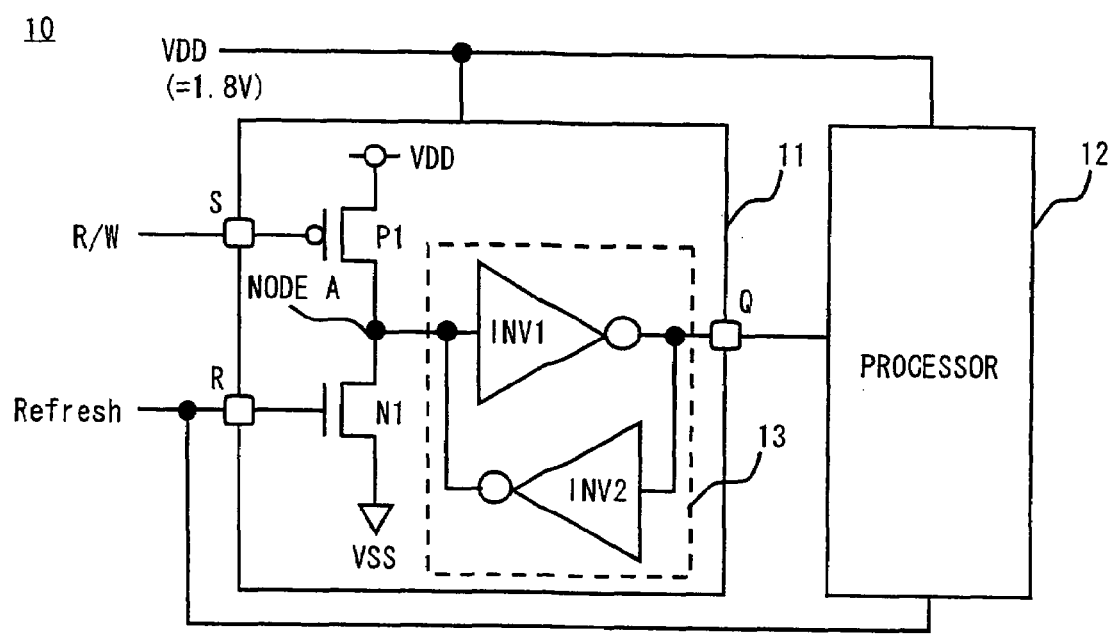
FIG. 3 is a circuit diagram of a semiconductor device according to a related art.
Figure 4:
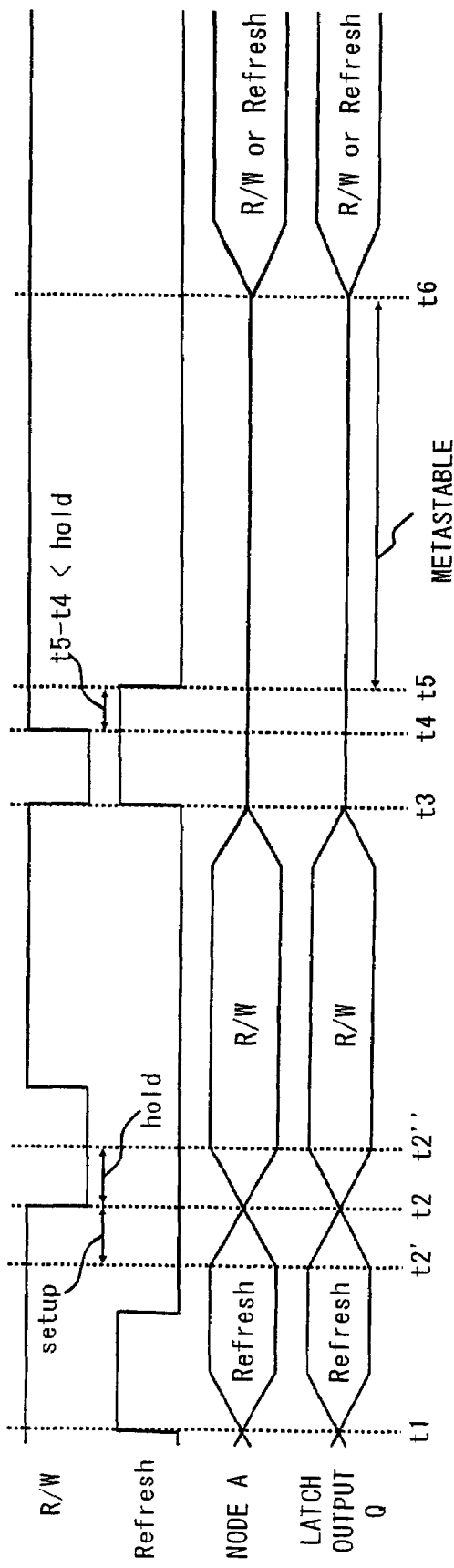
FIG. 4 is a view showing a timing chart of a latch circuit according to a related art.
Figure 5:
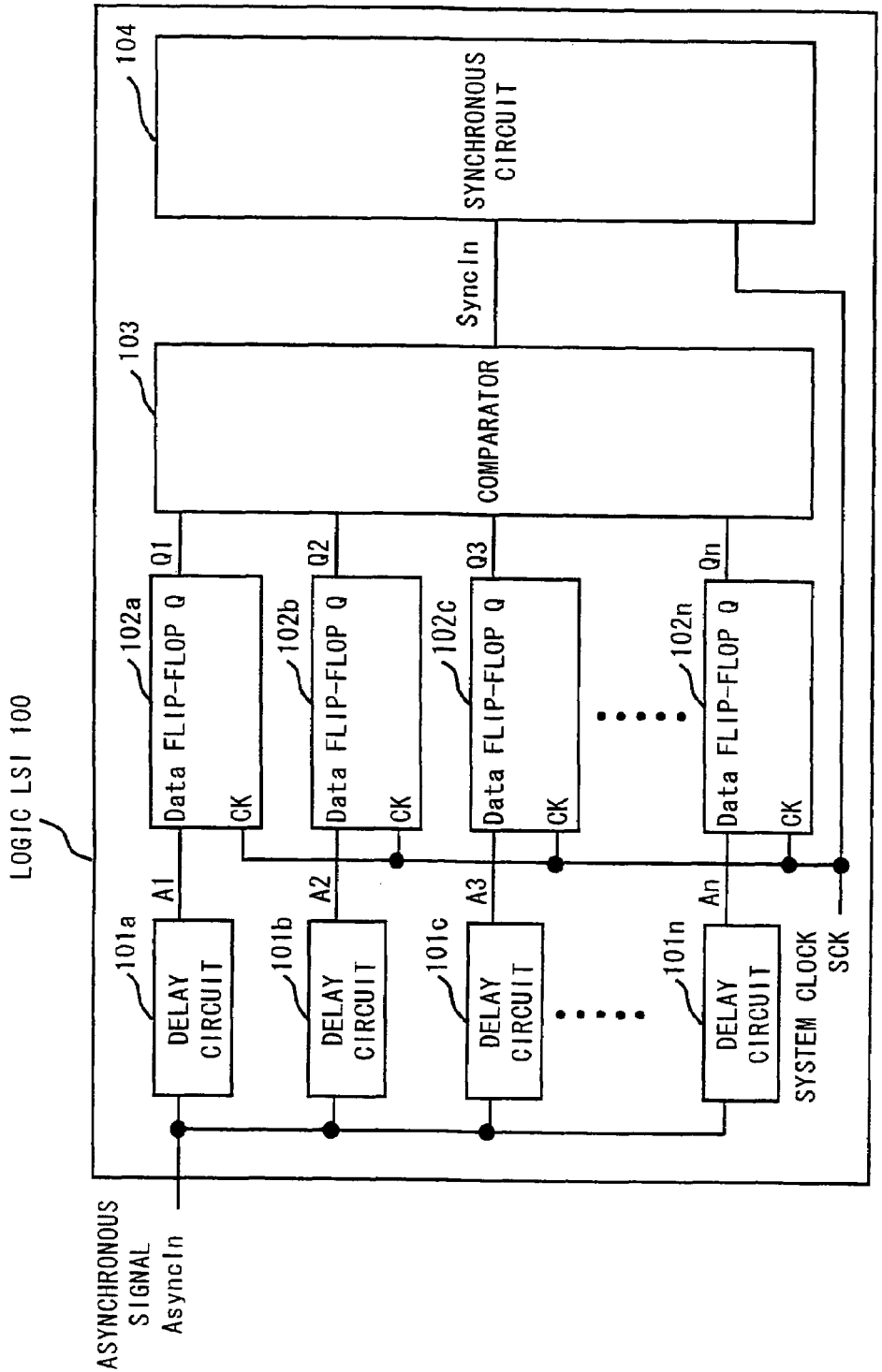
FIG. 5 is a block diagram of a semiconductor device according to a related art.

FIG. 2 shows an example of a timing chart indicating the operation of the latch circuit 2. The operation of the latch circuit 2 is described hereinafter with reference to FIG. 2. Upon input of a High-level Refresh signal to the reset terminal R, the latch circuit 2 keeps the output from the output terminal Q to the Refresh state until a Low-level R/W signal is input to the set terminal S. On the other hand, upon input of a Low-level R/W signal to the set terminal S, the latch circuit 2 keeps the output from the output terminal Q to the R/W state until a High-level Refresh signal is input to the reset terminal R.

In the timing chart of FIG. 2, after the Refresh signal turns High level at the timing t1, the output terminal Q is held to the Refresh state until the R/W signal turns Low level at the timing t2. After the R/W signal turns Low level at the timing t2, the output terminal Q is held to the R/W state until the R/W signal or the Refresh signal changes at the timing t3.

For the latch circuit 2, a setup time (setup) and a hold time (hold) are specified. The setup time is a time period during which one signal should hold a value before another signal changes. The hold time is a time period during which one signal should hold a value after another signal changes. Metastable states can occur if the specification of the setup time or the hold time is not met. The specification of each of the setup time or the hold time of this embodiment may be 1 nsec, for example. In the timing chart of FIG. 2, the setup time is specified as a time period from the timing t2' to the timing t2, and the hold time is specified as a time period from the timing t2 to the timing t2".

In this embodiment, because the R/W signal and the Refresh signal operate asynchronously with respect to each other, there is a possibility that the specification of the setup time or the hold time cannot be met. The operation in such a case is described hereinafter.

When the falling edge of the R/W signal and the rising edge of the Refresh signal occur at the same time at the timing t3, both of the PMOS transistor P1 and the NMOS transistor N1 become conductive and thereby the voltage at the node A becomes an intermediate voltage between the ground voltage VSS and the boosted voltage Vboot. In this state, the holding section 4 holds the intermediate voltage. After that, when the R/W signal becomes High level at the timing t4, the PMOS transistor P1 becomes non-conductive. Further, when the Refresh signal becomes Low level at the timing t5, the NMOS transistor N1 becomes non-conductive. If a time difference between the timing t5 and the timing t4 is shorter than the hold time, the state of the node A remains at the intermediate voltage without being stabilized at either High or Low level. As a result, the latch circuit 2 outputs a metastable state holding the intermediate voltage during the period between the timings t5 and t6. The intermediate voltage is stabilized at High or Low level in due course.

Because the latch circuit of this embodiment uses a transistor with high current capability, a time period until the voltage of the node A is stabilized at High or Low level after it becomes at an intermediate voltage (e.g. Vboot/2) is shorter than that in a latch circuit of the related art. Specifically, with the high current capability of the transistor, when the voltage of the node A shifts only slightly from the intermediate voltage, the slight change causes a large amount of current to flow into the node A. The latch circuit of this embodiment thereby achieves a prompt recovery from metastable states.

As described in the foregoing, the latch circuit of this embodiment reduces a period of a metastable state where an output is indeterminate. This prevents the transmission of a metastable state to a processor in the subsequent stage without connecting a delay circuit to the input or output of the latch circuit as in the related art. Although a time to recover from the metastable state is about 20 to 30 nsec in the latch circuit of the related art because the current capability of a transistor decreases as the power supply voltage becomes lower, it is as short as about 1 nsec, for example, in the latch circuit of this embodiment. In a DRAM, a time needed for the refresh operation or the read/write operation is about 20 to 30 nsec. Therefore, the metastable state of about 1 nsec does not affect the actual operation.

Further, this embodiment uses a boosted voltage Vboot as a power supply to the latch circuit 2. The boosted voltage Vboot is a voltage that is supplied to a memory cell, for example. Thus, the boosted voltage Vboot is an existing voltage that is generated inside the semiconductor device and used for another block. It is therefore not necessary to add another circuit for the operation of the latch circuit 2, thus not increasing the circuit size.

The present invention is not limited to the above-described embodiment and may be modified appropriately without departing from the scope and spirit of the invention. For example, a transistor used in the latch circuit is not necessarily the transistor described in the above embodiment as long as it has higher current capability than a transistor used in a processor.

It is apparent that the present invention is not limited to the above embodiment that may be modified and changed without departing from the scope and spirit of the invention.

What is claimed is:

1. A semiconductor device, comprising:
    a first power supply;
    a second power supply;
    a first logic circuit configured to operate based on the first power supply and the second power supply;
    a third power supply; and
    a second logic circuit configured to operate based on the first power supply and the third power supply,
    wherein the third power supply is boosted from the second power supply, and
    wherein the second logic circuit includes a holding section configured to hold a value generated according to a first signal and a second signal operating asynchronously with respect to each other.

2. The semiconductor device according to claim 1, wherein the second logic circuit is a latch circuit configured to hold a value generated according to the first signal and the second signal.

3. The semiconductor device according to claim 1, wherein the second logic circuit is configured to hold a first state for a period after a logic value of the first signal changes until a logic value of the second signal changes, and further configured to hold a second state for a period after a logic value of the second signal changes until a logic value of the first signal changes.

4. The semiconductor device according to claim 1, wherein the third power supply is generated inside the semiconductor device and supplies a voltage to a circuit other than the second logic circuit.

5. A semiconductor device, comprising:
a state holding circuit configured to operate according to a first signal and a second signal operating asynchronously with respect to the first signal, the state holding circuit including a holding section configured to hold a value generated according to the first signal and the second signal; and
a processor configured to operate according to the first signal and an output of the state holding circuit,
wherein the holding section comprises a transistor having a smaller resistance in a conducting state than a transistor of the processor, to receive an output of the state holding circuit, and
wherein the transistor used for the holding section receives a boosted voltage generated on the basis of a power supply supplied to the semiconductor device.

6. The semiconductor device according to claim 5, wherein the transistor used for the holding section has a lower threshold voltage than the transistor of the processor to receive an output of the state holding circuit.

7. The semiconductor device according to claim 5, wherein the transistor used for the holding section has a plurality of threshold voltages.

8. The semiconductor device according to claim 5, wherein the transistor used for the holding section has a variable threshold voltage.

9. A semiconductor device, comprising:
a booster configured to operate based on a first power supply and a second power supply and to generate a third power supply boosted from the second power supply; and
a logic circuit configured to operate based on the first power supply and the third power supply,
wherein the logic circuit comprises a first circuit and a holding section,
wherein the first circuit is configured to operate according to a first signal and a second signal, the first signal and the second signal input asynchronously with respect to each other, and
wherein the holding section is configured to hold an output of the first circuit.

10. The semiconductor device according to claim 1,
wherein the third power supply is provided by a booster configured to step up the second power supply, and
wherein the booster operates according to a voltage of the second power supply and a voltage of the first power supply.

11. The semiconductor device according to claim 10, wherein the booster is a charge pump.

12. The semiconductor device according to claim 5, wherein the boosted voltage is provided by a booster inside the semiconductor device and configured to boost a voltage of the power supply.

13. The semiconductor device according to claim 12, wherein the booster is a charge pump.

14. The semiconductor device according to claim 9, wherein the booster is provided inside the semiconductor device.

15. The semiconductor device according to claim 9, wherein the booster is a charge pump.

* * * * *